United States Patent [19]

Matsushita et al.

[11] Patent Number: 4,829,249
[45] Date of Patent: May 9, 1989

[54] METHOD OF INSPECTING MAGNETIC DISKS FOR SURFACE DEFECTS

[75] Inventors: Toshihiro Matsushita; Shin-ichi Satoh, both of Kanagawa, Japan

[73] Assignee: Fuji Photo Film Co., Ltd., Kanagawa, Japan

[21] Appl. No.: 13,806

[22] Filed: Feb. 12, 1987

[30] Foreign Application Priority Data

Feb. 12, 1986 [JP] Japan .................................. 61-28641

[51] Int. Cl.$^4$ ..................... G01R 33/12; G01N 27/82; G11B 5/84
[52] U.S. Cl. ........................................ 324/212; 360/31
[58] Field of Search .................. 324/210, 212; 360/31, 360/53; 371/21

[56] References Cited

FOREIGN PATENT DOCUMENTS

| | | | |
|---|---|---|---|
| 0160076 | 10/1982 | Japan | 324/210 |
| 0073472 | 4/1985 | Japan | 324/212 |
| 0108771 | 6/1985 | Japan | 324/210 |
| 0038476 | 2/1986 | Japan | 324/212 |

OTHER PUBLICATIONS pp. 15-16 of the 9th Draft (Dated Sep. 1, 1984), of the "Proposed American National Standard-Unformatted Flexible Carriage . . . ", Prepared by ISO.

Primary Examiner—Gerard R. Strecker
Attorney, Agent, or Firm—Sughrue, Mion, Zinn, Macpeak & Seas

[57] ABSTRACT

A method of inspecting surface defects in a magnetic disk. First, a predetermined inspection signal is recorded on a randomly selected track of the magnetic disk during a first rotation of the disk. Second, during a second rotation of the disk, the inspection signal is read and a read signal is produced. Then, during a third rotation of the disk, the value of the read signal is compared with a reference value to determine whether any surface defect exists, and a seek operation is performed to move to the next track of the magnetic disk which is inspected. During one of the second and third rotations of the disk, the read signal is used to set a new reference value to be used in a surface defect inspection of a new track to be inspected.

1 Claim, 1 Drawing Sheet

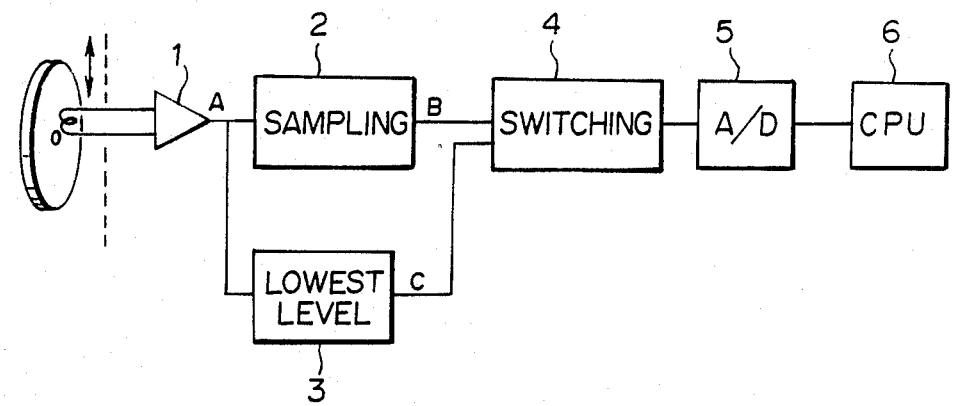

4,829,249

METHOD OF INSPECTING MAGNETIC DISKS FOR SURFACE DEFECTS

BACKGROUND OF THE INVENTION

1. Field of the Invention

This invention relates to a method of inspecting a magnetic disk such as a floppy disk, and more particularly, to a method of detecting surface defects in a magnetic disk in an inspection step of a magnetic disk manufacturing process.

2. Description of the Prior Art

When a surface defect due to fine irregularities in the magnetic layer or dust deposited on the magnetic layer exists in a magnetic disk, drop-out of information recorded on the disk can occur. Accordingly, magnetic disks having such surface defects must be rejected in the inspection step of the magnetic disk manufacturing process.

Conventionally the method of surface defect inspection comprises steps of recording a predetermined inspection signal on a randomly selected track of the magnetic disk during a first rotation of the disk; reading the inspection signal and setting a reference value for the disk during a second rotation of the disk; again reading the inspection signal, comparing the value of the read signal with the reference value and determining whether any surface defect exists based on the result of the comparison during a third rotation of the disk; and seeking for another inspection track during a fourth rotation of the disk. In accordance with the conventional method, a time corresponding to four rotations of the disk is required for inspection of one track.

The surface defect inspection must be effected on a plurality of tracks in real time, and accordingly the conventional method of surface defect inspection is disadvantageous in that the time required for inspection is long, which substantially adds to the manufacturing cost of the magnetic disk.

SUMMARY OF THE INVENTION

In view of the foregoing observations and description, the primary object of the present invention is to provide an improved method of detecting surface defects in a magnetic disk which can shorten the time required for the inspection without sacrificing the accuracy of the inspection.

The method of surface defect inspection in accordance with the present invention comprises steps of recording a predetermined inspection signal on a randomly selected track of the magnetic disk during a first rotation of the disk; reading the inspection signal to produce a read signal during a second rotation of the disk; and comparing, during a third rotation of the disk, the value of the read signal with a reference value to determine whether any surface defect exists and performing a seek operation during a third rotation of the disk, to move to a next track of the magnetic disk which is to be inspected during one of a second and third rotation of said disk, using said read signal to set a new reference value to be used in a surface defect inspection of a next track to be inspected.

In accordance with the present invention, the total time required for inspection of one track can be shortened by a time corresponding to one rotation of the disk since seeking for another inspection track which has conventionally been performed during the fourth rotation of the disk is performed during the third rotation of the disk together with the comparison of the value of the read signal with a reference value and the determination of whether surface defect exists.

Thus, the total time required for inspection of each disk can be shortened to three quarters of that conventionally required, thereby substantially lowering the manufacturing cost of the magnetic disk.

BRIEF DESCRIPTION OF A DRAWING

The single figure is a block diagram of a system for carrying out the method of the present invention.

DESCRIPTION OF THE PREFERRED EMBODIMENT

In the single figure, the system for carrying out the method of the present invention comprises a differential amplifier 1 for amplifying a read signal from a reader device (not shown), a sampling circuit 2 which receives an output signal A of the differential amplifier 1, samples the output signal A and outputs output signals B representing a part or the whole of the sampled output signal A, a lowest level detecting circuit 3 which holds the part of the output signal A having a lowest level and outputs it as a lowest level signal C, a switching circuit 4 which selectively outputs signals B and C in time, an A/D convertor 5 which converts the signals B and C into digital signals and a CPU (central processor unit) 6 which receives the signals B anc C in the form of digital signals and performs calculations such as, comparison of the signals, determination of whether a surface defect exists, and the output of a seek command signal for performing a seek operation during a third rotation of the disk, to move to a next track of the magnetic disk which is to be inspected.

In this particular system, when the lowest level signal C is lower than a reference signal (which will be described later), the CPU 6 basically determines that a surface defect exists in the disk and inspection of the disk is ended. On the other hand, when the lowest level signal C is constantly higher than the reference signal, the CPU 6 determines that no surface defect exists in the track and immediately outputs a seek command signal for moving the magnetic head to another track.

The reference signal is calculated on the basis of the signal B, for example, the reference signal may be a signal obtained by averaging the sampled signals B and multiplying the average of the signals B by a predetermined coefficient.

In this system, the sequence proceeds each time an index pulse is input after the magnetic head reaches a track to be inspected. The index pulse is generated once for each rotation of the disk.

When a first index pulse is input, a preset signal is recorded on the track. When a second index pulse is input, the recorded signal is read in the sampling circuit 2 and the lowest level detecting circuit 3. The signals B and C subsequently output from the sampling circuit 2 and the lowest level detecting circuit 3 are converted into digital signals by the A/D convertor 5 according to the sampling cycle and then input into the CPU 6. That is, all the signals required for inspection are once stored in the CPU 6. When a third index pulse is input, the CPU 6 calculates the reference level and compares the lowest level with the reference level. When it is determined that the lowest level is higher than the reference level, another track is sought and the magnetic head is moved to the track. Assuming that the disk is rotated at 300 rpm, the index pulse is generated every 200 milliseconds. Generally, the time required for seeking another track and moving the head to the track is 15 to 20 milliseconds and accordingly the calculation of the reference level and the comparison of the lowest level with the reference level is performed in 180 to 185 milliseconds, that is, 200 milliseconds less 15 to 20 milliseconds. That is, the time required for inspecting one track is 0.6 seconds, and when it is assumed that 80 tracks are inspected for each disk, each disk can be inspected in 48 seconds. This saves 16 seconds as compared with the conventional method in which inspection of one track is performed during four rotations of the disk.

A hard logic circuit may be used instead of the CPU 6 for calculation of the reference level and comparison of the lowest level with the reference level. In such a case, the reference level may be successively set during the time between the second and third index pulses in parallel with reading of the recorded signal.

We claim:

1. A method of inspecting a magnetic disk comprising the steps of:

recording a predetermined inspection signal on a randomly selected track of the magnetic disk during a first rotation of the disk;

reading the inspection signal to produce a read signal during a second rotation of the disk;

at the beginning of a third rotation of the disk, deriving from the read signal a reference value and comparing the value of the read signal with the reference value to determine whether any surface defect exists; and when it is determined that no surface defect exists, performing a seek operation, later during said third rotation of the disk, to move to a next track which is to be inspected.

* * * * *